United States Patent
Thysell et al.

[19]

[11] Patent Number: 6,090,476
[45] Date of Patent: Jul. 18, 2000

[54] CUBIC BORON NITRIDE CUTTING TOOL

[75] Inventors: Michael Thysell; Torbjörn Selinder, both of Stockholm, Sweden

[73] Assignee: Sandvik AB, Sandviken, Sweden

[21] Appl. No.: 08/992,818

[22] Filed: Dec. 18, 1997

[30] Foreign Application Priority Data

Dec. 20, 1996 [SE] Sweden .............................. 9604778-2

[51] Int. Cl.[7] .................................................... B32B 7/02
[52] U.S. Cl. ............................ 428/216; 51/307; 51/309;
407/119; 427/419.1; 427/419.2; 427/419.7;
428/212; 428/336; 428/469; 428/698; 428/701;
428/704
[58] Field of Search .................................. 428/408, 704,
428/701, 702, 698, 212, 216, 331, 469;
427/402, 419.1, 419.2, 419.7; 407/119;
51/307, 309

[56] References Cited

U.S. PATENT DOCUMENTS

| | | | |
|---|---|---|---|
| 5,135,801 | 8/1992 | Nystrom et al. | 428/216 |
| 5,326,380 | 7/1994 | Yao et al. | |
| 5,503,913 | 4/1996 | Konig et al. | |
| 5,639,285 | 6/1997 | Yao | 51/307 |
| 5,652,045 | 7/1997 | Nakamura et al. | 428/216 |
| 5,676,496 | 10/1997 | Littecke et al. | 407/118 |
| 5,705,263 | 1/1998 | Lenander et al. | 428/216 |
| 5,786,069 | 7/1998 | Ljungberg et al. | 428/216 |

FOREIGN PATENT DOCUMENTS

| | | |
|---|---|---|
| 0678594 A1 | 10/1995 | European Pat. Off. . |
| 0693574 A1 | 1/1996 | European Pat. Off. . |
| 0736615 A2 | 10/1996 | European Pat. Off. . |
| 0744242 A2 | 11/1996 | European Pat. Off. . |
| 80-25112 | 1/1996 | Japan . |

*Primary Examiner*—Archene Turner
*Attorney, Agent, or Firm*—Burns, Doane, Swecker & Mathis, L.L.P.

[57] ABSTRACT

A multilayer coated cutting tool comprising a cemented carbide body with at least one sintered-on inlay containing polycrystalline cubic boron nitride forming at least one cutting edge. Reduced crater wear of the rake face of the tool is achieved by reducing chemical interaction between tool and workpiece/chip material, and used edges of indexable inserts can be readily identified. The tool is provided with a multilayer coating by thermal CVD, the coating including (1) a first, innermost, layer of $TiC_xN_yO_z$ with $x+y+z=1$, with $y>x$ and $z<0.2$, with equiaxed grains with size $<0.5$ μm and a total thickness $<1.5$ μm, (2) a second layer of $TiC_xN_yO_z$ with $x+y+z=1$, preferably with $z=0$, $x>0.3$, most preferably $x>0.5$, having a thickness of 1–8 μm, with columnar grains, and (3) a third layer of a smooth, fine-grained (grain size about 1 μm) layer of ($\alpha$-$Al_2O_3$ or $\kappa$-$Al_2O_3$ or mixtures thereof, with a thickness of 2–10 μm.

29 Claims, 2 Drawing Sheets

CUBIC BORON NITRIDE CUTTING TOOL

FIELD OF THE INVENTION

The present invention relates to a coated cutting tool, more specifically to a multilayer coated polycrystalline cubic boron nitride tool, and a method of its production.

BACKGROUND OF THE INVENTION

Cutting tools in the form of, e.g., indexable inserts having cutting edges made of polycrystalline cubic boron nitride (PcBN) have been used for many years in chip forming machining of ferrous materials. Attractive properties of the PcBN include high toughness, good high temperature hardness and relatively high chemical inertness.

Normally, the PcBN used for cutting tools is a compound which consists of cubic boron nitride (cBN), mixed together with other hard constituents and/or metallic binder. The compound is sintered in a high temperature-high pressure process, often together with a cemented carbide support. Two main types of PCBN materials are presently being used for tools:

One type of PcBN material contains more than 80% cBN by weight and the remaining portion consists of a metallic binder phase, usually Co that originates in the cemented carbide part of the tool. An example of such a material is disclosed in U.S. Pat. No. 5,326,380. Tools made from this kind of, so-called, high cBN content PcBN material are often used for machining of cast irons.

Another type of PcBN material contains less cBN, about 60% cBN by weight, and the remainder is other hard and wear-resistant constituents such as carbides, nitrides, carbonitrides, oxides, borides of the metals of groups IVa to VIa of the Periodic Table, commonly Ti. An example of such a material is described in U.S. patent application Ser. No. 08/440,773. This kind of, so-called, low cBN content PcBN material is mainly used in cutting tools designed for machining of hardened steels and other hard materials.

Traditionally, PcBN tools consist of a PcBN inlay brazed into a pocket in a cemented carbide body, thus forming a cutting tool, which is subsequently ground to proper standard finished dimensions. Solders that are commonly used for brazing have melting points in the range of 600–840° C., which temperature defines an upper limit of thermal load in machining operations. If the temperature at the cBN/cemented carbide body bond is increased close to or beyond the melting point of the solder, the inlay might slide and cause malfunction of the tool.

An improvement of the PcBN concept is disclosed in U.S. patent application Ser. No. 08/446,490 in which is described a metal cutting insert comprising a cemented carbide body and at least one body of superhard abrasive material, such as polycrystalline diamond (PCD) or PcBN, bonded to an edge surface of the body and extending from one side surface to the other side surface thereof. There can be a plurality of superhard bodies disposed at respective corners of the body. The abrasive material is applied to the body in a container and then sintered and simultaneously bonded to the body in an elevated pressure/temperature step. Inserts can, for instance, be made either in rod form, i.e., in one piece, which thereafter can be transversely sliced into thin inserts, or the inserts can be made in separate pieces, with or without separators within the container.

In machining with PcBN tools, problems with crater wear of the PcBN phase often occur. The cause is a combination of abrasive wear and chemical dissolution of the tool material into the chip which gradually weakens the cutting edge, a process eventually leading to edge breakage. The chemical wear is caused by a chemical reaction between the tool material and the work piece at the elevated temperatures induced in the cutting zone. In a typical machining operation using the PcBN, tool wear on the flank is usually small or very small. This renders used edges difficult to distinguish from unused ones. The small wear marks on the insert flank are difficult to observe with bare eyes.

SUMMARY OF THE INVENTION

One objective of the present invention is to overcome drawbacks associated with prior art PcBN cutting tools.

Another objective of the present invention is to provide a wear resistant cutting tool, and a method of its production. The tool is meant for chip forming machining of hard to machine materials as for example hardened steels and cast irons. The invention reduces problems associated with chemical dissolution, crater wear, of the tool material on the rake face, and thus prolonging service life. It also solves problems of identifying used edges of an indexable tool.

DETAILED DESCRIPTION OF THE INVENTION

According to the invention a cutting tool is provided wherein a multilayer wear resistant coating is provided on a substrate comprising a cemented carbide body containing sintered-on PcBN inlays located at one or more cutting edges. The inlays have at least 40% cBN by weight and the multilayer wear resistant coating can be deposited using a high temperature CVD process in a high volume reactor.

Basically, the multilayer coating is constituted of a first, a second and a third layer, having excellent adhesion, wear resistance and chemical stability, respectively. Further adhesion enhancing, and diffusion retarding intermediary layers are optional, as are an outer layer of non-black coating for easier detection of used cutting edges.

Thanks to the lack of solder bond, the tool of the invention may be coated using a high temperature CVD process in economical production scale equipment. The coated tool shows excellent coating adhesion with a favorable degree of chemical reaction between the sintered superhard inlay and the coating. The out-diffusion of binder phase elements from the superhard inlay into the coating may be controlled by the formation of an intermediate layer, this layer also having the beneficial effect of creating improved adherence between two subsequent coating layers due to its high specific surface. The use of high temperature CVD process also enables deposition of aluminum oxide, which significantly increases the oxidation- and crater-wear resistance for the PcBN tool, according to the invention. A combination of the high temperature CVD coatings provides a PcBN tool with attractive properties that expands the present technical application areas for PcBN tools. The practical use of the tool may further be improved by depositing a non-transparent, non-black surface layer for easier detection of used edges.

Figure 1:
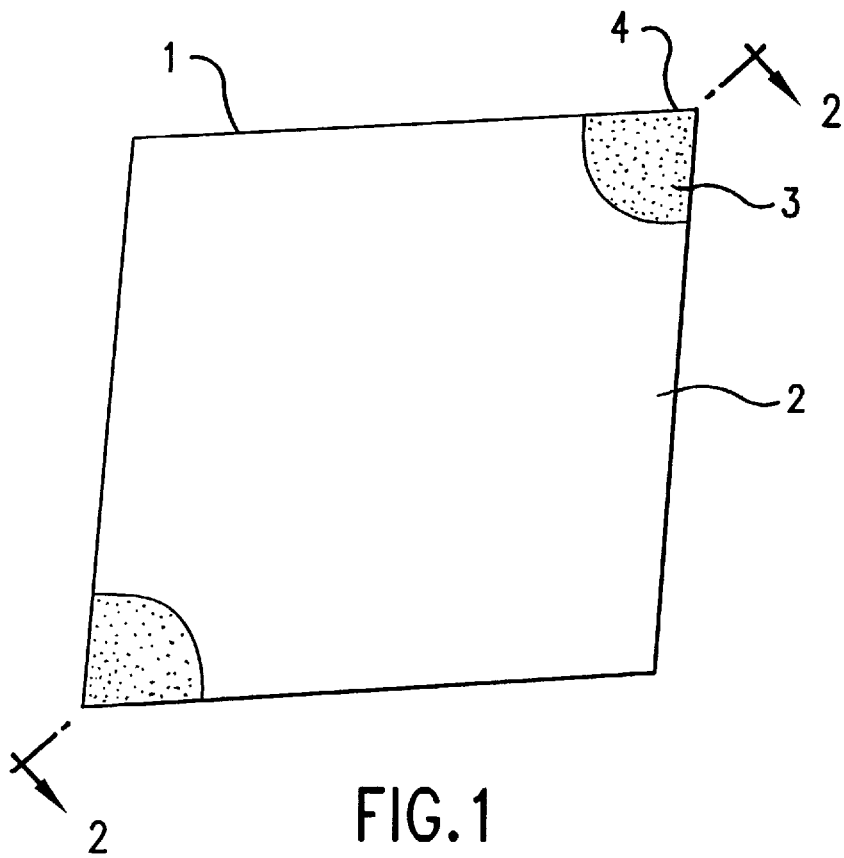
FIG. 1 shows a top view of a coated PcBN cutting tool in accordance with the invention.
Figure 2:
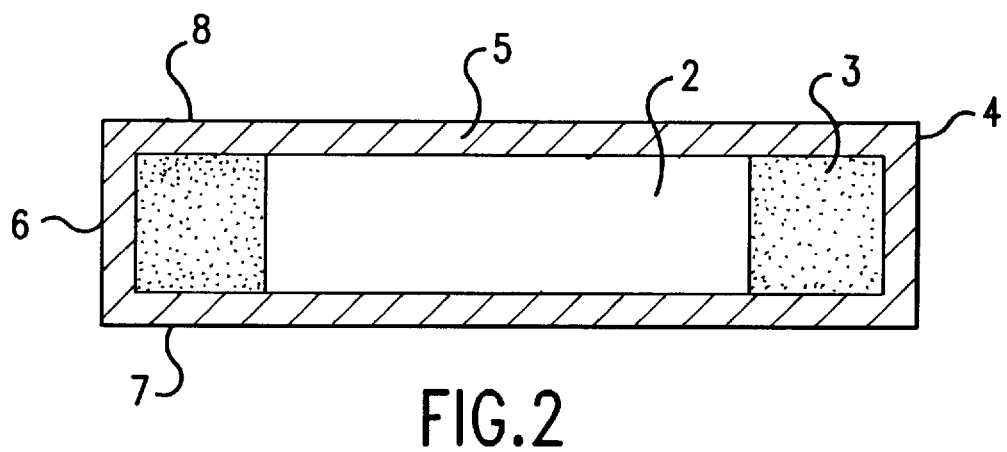
FIG. 2 illustrates a diagonal cross section of the PcBN cutting tool shown in FIG. 1.
Figure 3A:
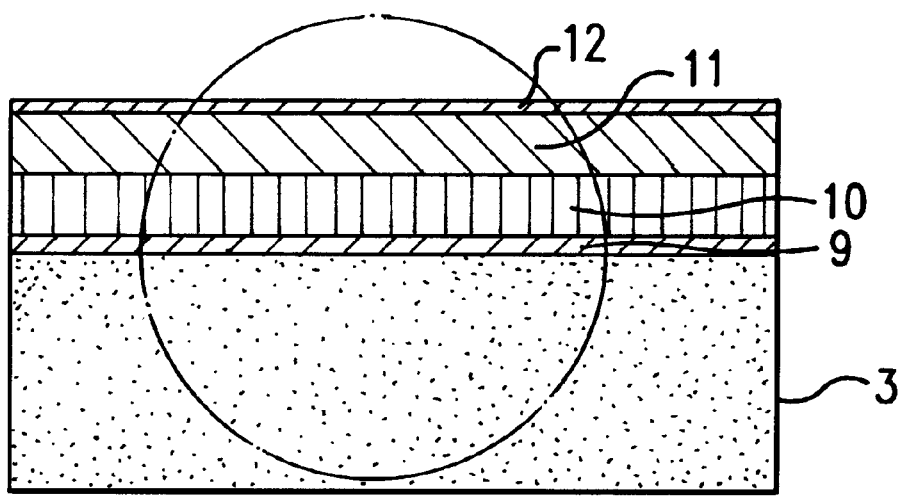
FIGS. 3a–b show detailed cross sectional views of a multilayer coated PcBN cutting tool in accordance with the invention.
Figure 3B:
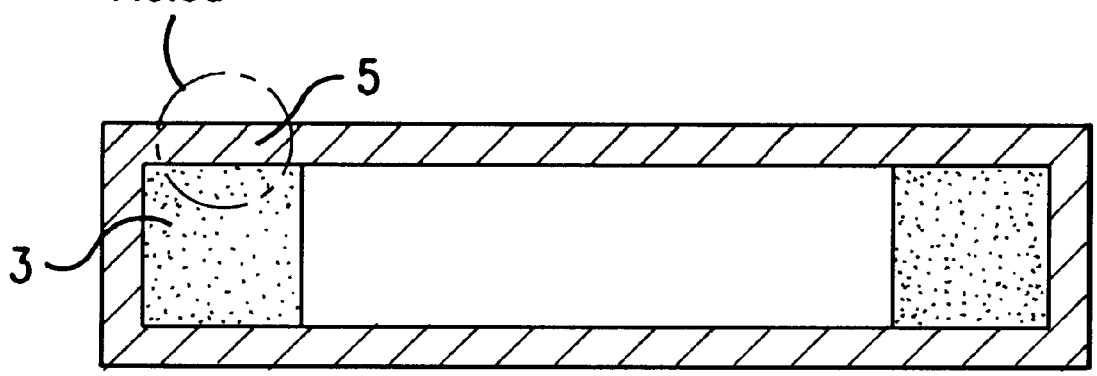

Various aspects of the invention are explained with reference to FIGS. 1–3. FIG. 1 shows a top view of a coated PcBN cutting tool (1) comprising a cemented carbide body (2) with a sintered-on inlay (3) forming a cutting edge (4). FIG. 2 illustrates a diagonal cross section of the coated PcBN cutting tool where (5) is the coating and (6) is the edge surface extending from one side surface (7) to an other side surface (8). FIG. 3a shows a detailed cross sectional view of a multilayer coated PcBN tool with (9) being the first layer, (10) the second layer, (11) the third layer and (12) an optional outer, non-black, layer and FIG. 3b is an enlarged view of a portion of FIG. 3a.

The cutting tool according to the invention can be of any shape containing a cemented carbide body with sintered-on inlays of superhard abrasive material at the cutting edge or cutting edges, e.g., drills, end mills, indexable inserts, preferably a multi corner type insert made according to U.S. patent application Ser. No. 08/446,490. A schematic top view of a preferred embodiment of the disclosed tool is shown in FIG. 1 wherein an indexable insert (1) comprises a cemented carbide body (2), and at least one sintered-on inlay (3) of superhard abrasive material, such as PCD or PcBN, bonded to an edge surface (6) of the body (2) and preferably extending from one side surface (7) to the opposite side surface (8) thereof, as shown in the schematic cross section along a diagonal of the insert (1) in FIG. 2. There can be a plurality of superhard inlays (3) disposed at other edge surfaces of the body (2), yielding at least one cutting edge (4). The superhard abrasive material inlay (3) is applied to the body (2) as a powder, in its unsintered condition, in a container and then sintered and simultaneously bonded to the body (2) in an elevated pressure/temperature step. Tools can, for instance, be made in rod form, i.e., a tool in one piece, which in the preferred embodiment may be transversely sliced into thin inserts, or the inserts can be made in separate pieces, with or without separators within the container.

The cemented carbide body (2) is preferably of WC-Co with 10–20%, most preferably 15–17% Co by weight.

The PcBN inlay (3) contains more than 40% cBN by weight, in one preferred embodiment 50–70% cBN, or in an alternative preferred embodiment, more than 80% cBN, depending on the desired type of PcBN material as described earlier in the text. The balance preferably consists of metal binder, such as Co, and of hard and wear-resistant ceramic constituents such as carbides, nitrides, carbonitrides, oxides, borides of the metals of groups IVa to VIa of the Periodic Table as known in the art, preferably titanium. In one preferred embodiment the binder is of ceramic type and in an alternative preferred embodiment the binder is metallic.

The coating (5) shown in the cross section in FIG. 2 is of multilayer type comprising combinations of any number of layers, at least three, of M(N,C,O) where M is a metal from groups IVa to VIa of the Periodic Table, and $Al_2O_3$. FIG. 3 shows the cross section in greater detail. In one embodiment the multilayer coating comprises:

1) a first, innermost, layer (9) of $TiC_xN_yO_z$ with $x+y+z=1$, preferably $y>x$ and $z<0.2$, most preferably $y>0.8$ and $z=0$, with equiaxed grains with size $<0.5$ $\mu m$ and a total thickness $<1.5$ $\mu m$, preferably $>0.1$ $\mu m$.

2) a second layer (10) of $TiC_xN_yO_z$ with $x+y+z=1$, preferably with $z=0$, $x>0.3$, most preferably $x>0.5$, having a thickness of 1–8 $\mu m$, preferably 3–7 $\mu m$, with columnar grains having an average diameter of $<5$ $\mu m$, preferably 0.1–2 $\mu m$. The second layer (10) may be deposited using conventional thermal CVD- or preferably by MT-CVD-techniques.

3) a third layer (11) of a smooth, fine-grained (grain size about 1 $\mu m$) $\alpha$- or $\kappa$-$Al_2O_3$ layer or mixtures thereof having a thickness of 2–10 $\mu m$, preferably 3–6 $\mu m$. Preferably, the third layer (11) of $Al_2O_3$ is the outermost layer but it may also be followed by further layers preferably a thin ($<2$, preferably about 0.01–0.5 $\mu m$) layer (12) of a non-black coating, e.g., TiN for easier detection of used edges.

4) Optionally, where $z=0$ for the first and second $TiC_xN_yO_z$-layers there may be one or more intermediary layers of $TiC_xN_yO_z$ with $x+y+z=1$, $0.1<z<0.5$, (preferably $x=0.6$, $y=0.2$ and $z=0.2$) with a thickness in the range of 0.1–2.0 $\mu m$, preferably 0.1 $\mu m$–0.5 $\mu m$, having equiaxed or, preferably needlelike, grains of size $<0.5$ $\infty m$, deposited on the tool (1) replacing the first layer, or prior to the first layer, or on the first layer prior to the second, and so forth. Preferably, the intermediary layer is present between the first and the second layer and/or between the second layer (10) and the third layer (11). Such intermediary layers have the beneficial property of increasing adhesion between two subsequent coatings in the multilayer structure, and they also to a substantial degree limit out-diffusion of binder phase from the underlying cemented carbide body or the cBN inlay.

The coated inserts may be mechanically treated in order to further improve tool performance. Examples of such post treatments are brushing or blasting which make the inserts not only more smooth and shiny, but also reduce the affinity to the work piece material and change the stress state of the coating. Especially, the edge line performance is improved by the mechanical treatment so that the edge line becomes more smooth and less likely to suffer from flaking. In doing this, the outer TiN layer (12) may be removed partially or completely and an underlying $Al_2O_3$-layer (11) partially or completely removed along the cutting edge.

The present invention also relates to a method of depositing a multilayer coating using thermally activated chemical vapor deposition (CVD) procedures performed in a production scale, cylindrical, hot-wall CVD reactor, preferably equipped with a central, rotating gas distributor tube, hence the process gas is flowing radially. The method can be carried out by a deposition process using known CVD techniques at temperatures in excess of 850° C. with;

1) a first layer of $TiC_xN_yO_z$ with a thickness of 0.1–2 $\mu m$, with equiaxed grains with size $<0.5$ $\mu m$;

2) a second layer of $TiC_xN_yO_z$ with a thickness of 2–15 $\mu m$ with columnar grains and with a diameter of $<5$ $\mu m$ using MTCVD-technique with acetonitrile as the carbon and nitrogen source for forming the layer, preferably at a temperature range of 850–900° C.;

3) a third layer of a smooth $\alpha$- or $\kappa$-$Al_2O_3$-layer with a thickness of 2–10 $\mu m$;

4) an optional outer layer of non-transparent, non-black coating of, e.g., TiN with a thickness of $<2$, preferably 0.01–0.5 $\mu m$.

In a preferred embodiment at least one intermediary layer of $TiC_xN_yO_z$ is deposited with a thickness of 0.1–2 $\mu m$, and with equiaxed or needle like grains with size $<0.5$ $\mu m$, using known CVD-methods, and in the case of $z>0$, the oxygen preferably being introduced by means of $CO_2$ or CO additions to the process gas.

In a further preferred embodiment the outer and the third layer are, partially or completely, removed from a region along the cutting edge by mechanical brushing or grit blasting.

The following examples further illustrate various aspects of the invention.

EXAMPLE 1

Indexable multi-corner inserts consisting of a cemented carbide body with composition 15% Co by weight and 85% WC were provided with sintered-on PcBN inlays having a cBN content of 60% by weight and 40% of Ti(C,N). The insert was of the shape CNGN 120408 S01020, and the inlays were firmly sintered on to the cemented carbide body, as described above and as described in U.S. patent application Ser. No. 08/446,490, the disclosure of which is hereby incorporated by reference. The inserts were subsequently coated using a thermal CVD process, described in more detail below.

The coating procedure was performed, according to the description above, in a production scale cylindrical hot-wall CVD reactor equipped with a central, rotating gas distributor tube, with gas flowing in the radial direction. The tools were provided with a multilayer coating according to the following: A 0.5 $\mu$m equiaxed first TiCN-layer was deposited followed by a 4 $\mu$m thick second TiCN-layer with pronounced columnar grains by using the MTCVD-technique (process temperature 850° C. and $CH_3CN$ as the carbon/nitrogen source). In subsequent process steps during the same coating cycle, a 1 $\mu$m thick intermediary layer of $TiC_xN_yO_z$ (about x=0.6, y=0.2 and z=0.2) with needle-like grains was deposited. A third layer was deposited, which was a 5.5 $\mu$m thick layer of $\alpha$-$Al_2O_3$ deposited at a temperature of 1020° C., according to conditions given in U.S. Pat. No. 5,654,035, the disclosure of which is hereby incorporated by reference. Finally, a 0.3 $\mu$m outer coating of TiN was applied, as a decorative layer which also facilitated detection of used tool cutting edges.

The multilayer coating exhibited excellent adherence, to the PcBN inlay as well as to the cemented carbide body. A network of cooling cracks was detected using SEM. Also, visible by optical microscopy in a polished cross section, were 0.5–1.0 $\mu$m sized spots of metallic Co, located at the interface between the second layer, and the intermediary layer. The Co was originating in the PcBN inlay, and was diffusing out through the first and the second layer during the coating process. However, the intermediary layer blocked further out diffusion, causing the Co to collect underneath it. In this way it was possible to thwart degradation of the third alumina layer and its adhesion, by formation of undesired Co-containing phases.

EXAMPLE 2

A tool was prepared as set forth in Example 1 except that the alumina layer consisted of $\kappa$-alumina. The $\kappa$-alumina surface had a smoother appearance than that of $\alpha$-alumina.

EXAMPLE 3

A tool was prepared as set forth in Example 1 except that the tool was also subjected to a post coating mechanical procedure of blasting using 160 mesh alumina grit and a blasting pressure of 2.2 bars. The blasting procedure provided the tool surface with a smooth appearance.

EXAMPLE 4

A tool was prepared as set forth in Example 1 except that the additional intermediary layer of 0.5 $\mu$m thick $TiC_xN_yO_z$ (about x=0.6, y=0.2 and z=0.2) with needle-like grains was deposited between the first and the second layer. The additional intermediate layer made it possible to even further limit the Co out diffusion from the cemented carbide or cBN.

EXAMPLE 5

A coated insert according to Example 1 was compared, in a turning test, to an uncoated reference insert of the same type. The test parameters were:

Work piece material: Hardened ball bearing steel DIN 100CrMo6 with a hardness of 60 HRC.

| | |
|---|---|
| Cutting speed | 100 m/min |
| Feed | 0.20 mm/rev |
| Depth of cut | 0.15 mm |
| Type of operation | facing |
| Cutting fluid | yes |
| Tool life criterion | edge breakage |

The coated cutting tool lasted 95 passes before breakage, while the uncoated reference suffered breakage after only 60 passes. The coated tool showed less flank wear compared to the uncoated reference. The main difference in edge performance, however, is that the coated tool exhibited significantly less crater wear than that of the uncoated reference after the same machining time. Tool failure in both cases occurred due to crater wear, a process in which the tool material is gradually dissolved in the chip, and thus material is being removed from the tool surface. As the crater reaches larger size and depth the cutting edge is gradually weakened, until catastrophic failure entails. This dissolution proceeded to a significantly lesser extent for the coated tool than for the uncoated one.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A polycrystalline cubic boron nitride (PcBN) tool comprising a body containing more than 40% by weight polycrystalline cubic boron nitride, the tool further including a coating of at least one layer of $MC_xN_yO_z$ where M is a metal from groups IVa to VIa of the Periodic Table, x+y+z=1, thickness of 1 to 8 $\mu$m, and columnar grains having a diameter of less than 5 $\mu$m.

2. The tool according to claim 1, wherein the coating is a multilayer coating which comprises at least a first, a second, and a third layer;

the first layer being $TiC_xN_yO_z$ with x+y+z=1, with y>x and z<0.2, with equiaxed grains with size <0.5 $\mu$m and a thickness <1.5 $\mu$m;

the second layer being $TiC_xN_yO_z$ with x+y+z=1, having a thickness of 1 to 8 $\mu$m, with columnar grains having an average diameter of <5 $\mu$m;

the third layer being a smooth, fine-grained layer of $\alpha$-$Al_2O_3$ or $\kappa$-$Al_2O_3$ or mixtures thereof with a thickness of 2 to 10 $\mu$m.

3. The tool according to claim 2, wherein the multilayer coating further comprises at least one intermediary layer of $TiC_xN_yO_z$ with x+y+z=1, y<0.1, 0.1<z<0.5, with equiaxed or needlelike grains of size <0.5 $\mu$m and thickness <1.0 $\mu$m, said intermediary layer being located between the body and the first layer, between the first layer and the second layer, and/or between the second layer and the third layer.

4. The tool according to claim 3, wherein the intermediary layer is present between the second layer and the third layer.

5. The tool according to claim 3, wherein the intermediary layer includes inner and outer intermediary layers, the inner intermediary layer being between the first layer and the second layer, and the outer intermediary layer between the second layer and the third layer.

6. The tool according to claim 1, wherein the body consists of WC—Co with 10 to 20% by weight.

7. The tool according to claim 1, wherein the coating is a multilayer coating is partially removed from a region along a cutting edge.

8. The tool according to claim 2, wherein the first layer is $TiC_xN_y$ with y>0.8.

9. The tool according to claim 2, wherein the first layer is $TiC_xN_y$ with the thickness <0.5 $\mu$m.

10. The tool according to claim 2, wherein the second layer is $TiC_xN_y$ with x>0.5.

11. The tool according to claim 2, wherein the second layer is $TiC_xN_y$ with the thickness 3 to 7 $\mu$m.

12. The tool according to claim 2, wherein the second layer is $TiC_xN_y$ with the columnar grains average diameter 0.1 to 2 $\mu$m.

13. The tool according to claim 2, wherein the grain size of the third layer is about 1 $\mu$m and the thickness of the third layer is 3 to 6 $\mu$m.

14. The tool according to claim 3, wherein the thickness of the intermediary layer is <2, preferably 0.1 to 0.5 $\mu$m.

15. The tool according to claim 6, wherein the body includes 15 to 17 wt % Co.

16. The tool according to claim 1, further comprising an outer non-black coating.

17. The tool according to claim 1, wherein the coating further comprises a layer of alpha alumina or kappa alumina with total thickness of the coating in the range of 5 to 14 $\mu$m.

18. The tool according to claim 1, wherein the tool further comprises a cemented carbide body.

19. The tool according to claim 1, wherein the polycrystalline cubic boron nitride comprises a sintered-on inlay at an edge surface of the body.

20. The tool according to claim 18, wherein the polycrystalline cubic boron nitride comprises a sintered-on inlay at an edge surface of the body.

21. A method of manufacturing a polycrystalline cubic boron nitride (PcBN) tool comprising a cemented carbide body, having at least one sintered-on inlay at an edge surface of the body, said inlay containing more than 40% by weight polycrystalline cubic boron nitride, forming at least one cutting edge, the tool further including a multilayer coating comprising a combination of one or more layers of M(N,C,O) where M is a metal from groups IVa to VIa of the Periodic Table, and $Al_2O_3$ with a total thickness of the multilayer coating in the range of 5 to 14 $\mu$m, the multilayer coating being deposited by CVD at temperatures in excess of 850° C., the multilayer coating including:

a first layer of $TiC_xN_yO_z$ with a thickness of 0.1 to 2 $\mu$m, with equiaxed grains with size <0.5 $\mu$m;

a second layer of $TiC_xN_yO_z$ with a thickness of 2 to 15 $\mu$m with columnar grains and with a diameter of <5 $\mu$m using MTCVD-technique with acetonitrile as the carbon and nitrogen source for forming the second layer;

a third layer of a smooth $\alpha$-$Al_2O_3$ or $\kappa$-$Al_2O_3$ or mixtures thereof with a thickness of 2 to 10 $\mu$m; and an optional outer layer of non-transparent, non-black coating with a thickness of <2 $\mu$m.

22. The method according to claim 21, wherein at least one intermediary layer of $TiC_xN_yO_z$ is deposited with a thickness of 0.1–2 $\mu$m, and with equiaxed or needlelike grains with size <0.5 $\mu$m.

23. The method according to claim 21, wherein the outer layer and the third layer are, partially or completely, removed from a region along the cutting edge by mechanical brushing or grit blasting.

24. The method according to claim 21, wherein the second layer is deposited in a temperature range of 850 to 900° C.

25. The method according to claim 21, wherein the outer layer is deposited as a TiN layer.

26. The method according to claim 22, wherein the intermediary layer is deposited by CVD using $CO_2$ or CO to provide $TiC_xN_yO_z$ with z>0.

27. The method according to claim 22, wherein the intermediary layer is between the cemented carbide or polycrystalline cubic boron nitride inlay and the first layer, between the first layer and the second layer, and/or between the second layer and the third layer.

28. The method of claim 21, wherein the outer layer has a thickness of 0.01 to 0.5 $\mu$m.

29. A method of machining hardened steel or other hardened materials by contacting a workpiece of the hardened steel or other hardened material with the cutting tool according to claim 1, the method comprising moving the workpiece and the cutting tool relative to each other and removing material from the workpiece as a result of contact with a cutting edge of the cutting tool.

* * * * *